(12) United States Patent
Richard et al.

(10) Patent No.: US 10,567,317 B2
(45) Date of Patent: Feb. 18, 2020

(54) METHOD FOR GENERATING A DATASET DEFINING A MESSAGE FOR A CONSTRAINED APPLICATION

(71) Applicant: BULL SAS, Les Clayes-sous-Bois (FR)

(72) Inventors: Julien Richard, Vitrolles (FR); Alexandre Roman, Hyères (FR)

( * ) Notice: Subject to any disclaimer, the term of this patent is extended or adjusted under 35 U.S.C. 154(b) by 64 days.

(21) Appl. No.: 15/354,499

(22) Filed: Nov. 17, 2016

(65) Prior Publication Data
US 2017/0142037 A1   May 18, 2017

(30) Foreign Application Priority Data
Nov. 18, 2015 (FR) .................................. 1502418

(51) Int. Cl.
*H04L 12/58* (2006.01)
*H04L 12/911* (2013.01)

(52) U.S. Cl.
CPC ............ *H04L 51/04* (2013.01); *H04L 47/821* (2013.01)

(58) Field of Classification Search
CPC ... H04L 51/04; H04L 47/821; H04L 67/2842; H04L 12/58; H04L 12/911; H04L 29/08; H04L 67/1004; G06F 17/30; G06Q 10/06
See application file for complete search history.

(56) References Cited

U.S. PATENT DOCUMENTS

| | | | | |
|---|---|---|---|---|
| 5,941,959 A * | 8/1999 | Fishler | ............... | G06F 9/544 709/200 |
| 5,954,794 A * | 9/1999 | Fishler | ............... | G06F 9/544 709/213 |
| 6,260,059 B1 * | 7/2001 | Ueno | ............... | G06N 5/043 709/202 |
| 6,539,398 B1 * | 3/2003 | Hannan | ............... | G06F 17/30 |
| 6,789,128 B1 * | 9/2004 | Harrison | ............... | H04L 69/04 707/999.202 |
| 7,080,078 B1 * | 7/2006 | Slaughter | ............... | G06F 9/465 |
| 7,200,848 B1 * | 4/2007 | Slaughter | ............... | H04L 63/101 709/202 |

(Continued)

FOREIGN PATENT DOCUMENTS

| | | |
|---|---|---|
| EP | 2 849 076 A1 | 3/2015 |
| WO | WO 2004/023328 A1 | 3/2004 |
| WO | WO 2008/072093 A2 | 6/2008 |

OTHER PUBLICATIONS

Search Report and Written Opinion as issued in French Patent Application No. 1502418, dated Sep. 21, 2016.

*Primary Examiner* — Kostas J Katsikis
(74) *Attorney, Agent, or Firm* — Pillsbury Winthrop Shaw Pittman LLP

(57) ABSTRACT

Disclosed is a process for generating a library of messages that are transmittable in a radio environment with constrained bandwidth. The process may include defining a first descriptor of a set of messages, each message including a set of attributes. Each of the attributes of the each message may include a reduced type. The descriptor may also describe the set of reduced types, and each of the reduced types may be encoded from an original type. The process may further include a transformation of the first descriptor into a library of preconfigured messages that defines a given repository and an instantiation of a message of the repository to generate a dataset in a memory.

10 Claims, 2 Drawing Sheets

(56) References Cited

U.S. PATENT DOCUMENTS

| | | | | |
|---|---|---|---|---|
| 7,260,543 B1* | 8/2007 | Saulpaugh | G06Q 10/02 | 705/307 |
| 8,135,796 B1* | 3/2012 | Slaughter | G06F 9/465 | 709/217 |
| 8,472,463 B1* | 6/2013 | Ji | H04W 74/0808 | 370/439 |
| 2004/0194105 A1* | 9/2004 | Shenfield | H04L 69/04 | 718/100 |
| 2004/0252348 A1* | 12/2004 | Desai | H04N 1/00209 | 358/400 |
| 2006/0029106 A1* | 2/2006 | Ott | G09B 7/02 | 370/522 |
| 2006/0168318 A1* | 7/2006 | Twiss | H04L 45/00 | 709/238 |
| 2006/0276207 A1* | 12/2006 | Harris | H04W 4/12 | 455/466 |
| 2007/0060367 A1* | 3/2007 | Heler | G06Q 10/06 | 463/42 |
| 2007/0090180 A1* | 4/2007 | Griffis | G06Q 10/06 | 235/376 |
| 2007/0198968 A1* | 8/2007 | Shenfield | G06F 8/10 | 717/104 |
| 2009/0055497 A1* | 2/2009 | Dickerson | G06Q 10/06 | 709/207 |
| 2011/0103393 A1* | 5/2011 | Meier | H04L 12/66 | 370/401 |
| 2012/0124249 A1* | 5/2012 | Blocksome | G06F 13/28 | 710/22 |
| 2014/0006541 A1* | 1/2014 | Bittles | G06F 3/067 | 709/213 |
| 2014/0310369 A1* | 10/2014 | Makhervaks | G06F 13/14 | 709/207 |
| 2015/0281126 A1* | 10/2015 | Regula | G06F 13/4022 | 709/212 |
| 2017/0171143 A1* | 6/2017 | Ge | H04L 51/36 | |

* cited by examiner

METHOD FOR GENERATING A DATASET DEFINING A MESSAGE FOR A CONSTRAINED APPLICATION

CROSS REFERENCE TO RELATED APPLICATIONS

This application claims priority to French Patent Application No. 1502418, filed Nov. 18, 2015, the entire content of which is incorporated herein by reference in its entirety.

FIELD

The field of the invention relates to the generation of data defining a message the size of which is optimised for constrained applications. More specifically, the invention relates to the generation of command messages within a tactical information system within which the transmission rates are constrained. More specifically, the invention relates to operations intended to minimise the physical data space required to print messages and to use of an environment enabling such messages to be defined and instantiated.

STATE OF THE ART

In the field of tactical telecommunications, in particular ones which are deployed in construction trades or in organisations which must standardise their communications, the definition of the electronic messaging systems must satisfy stronger constraints than those of conventional electronic messaging systems used in consumer applications. The possibilities for defining objects freely are more limited, since this freedom can lead to assessment errors, or to differences of implementation of nomenclatures or of standards used by different organisations in communication with one another. It is recommended to limit or constrain the input checks if information must be transmitted in a predefined formalism with certainty.

Finally, depending on the data transmission context, the users of electronic messaging systems do not have permanent access to a high data transmission rate. This is the case, for example, in an operation within which agents must travel to locations without communication infrastructure to undertake local missions over a given period. Other situations imply an allocation of limited transmission rate; in these contexts it is then necessary that the communications can be established at minimum to transmit a necessary minimum of information to accomplish the mission.

There is therefore a requirement to define a solution enabling data to be transmitted between different entities which is compatible with a limited transmission rate. However, one problem is that transmission of certain messages of a given repository requires that certain minimal resources and a minimum bandwidth are available. This is the case, for example, when a position defined in a given repository is encoded over 16 bytes, whereas a position simply encoded over 2 bytes would be sufficient to inform a third party of the said position which it is desired to communicate to it.

One solution consists in changing the electronic message repository to restrict the volume of data to be transmitted. In this solution the objects, i.e. the messages, the attributes and the attribute types are redefined in terms of their byte size in order to be compatible with a transmission rate constraint. A first problem then becomes that of interoperability between the different communication entities. A second problem is how to ensure that it is always possible to change to a new repository.

When an electronic messaging system requires that the encoding of the messages must be modified, it is imperative that all entities are able to receive and decode the received messages which can be interpreted by this electronic messaging system.

In addition, the definition of new types or optimised messages requires extensive knowledge of the structure of the messages and a time-consuming definition, which must be included when it is expected that it will change.

There is therefore a requirement to define a secure means of a set of messages intended for constrained applications, i.e. with optimisation of the size of each message.

SUMMARY OF THE INVENTION

The invention seeks to resolve the above-mentioned disadvantages. In particular, the invention enables a library of messages to be generated which are optimised in terms of their byte-size, and which constitute an electronic message repository, ensuring that it is always possible to change this repository.

The invention also enables encoded types to be defined to be optimised in order to reduce the volume of space required to transmit a message according to a given transmission rate constraint. The invention also ensures compatibility with an electronic messaging system receiving an optimised message.

One object of the invention relates to a method for generating a dataset defining a message. It includes:
  A definition of a first descriptor of a set of messages, where each message includes a set of attributes each including a reduced type, where the said descriptor also describes the set of reduced types, and where each reduced type is encoded from an original type;
  A transformation of the first descriptor into a library of preconfigured messages defining a given repository;
  An instantiation of a message of the repository to generate a dataset in a memory.

According to one embodiment, the definition of the first descriptor includes a set of rules defining ranges of values of a reduced type, where the said ranges of values are included in the ranges of values defining an original type.

According to one embodiment, an encoding of a reduced type includes a reduction of the number of bytes encoding an original type.

According to one embodiment, the encoding of a reduced type includes the selection of a type other than the original type, where the said other type has fewer bytes than the number of bytes of the original type.

According to one embodiment, the encoding of a reduced type includes a truncation of an original type.

According to one embodiment, the encoding of a reduced type includes an extract from a list of values of an original type.

According to one embodiment, the transformation of the first descriptor includes:
  the generation of a second descriptor;
  the compilation of the second descriptor to generate:
    a library of preconfigured messages;
    a function to instantiate a selected message.

Another object of the invention relates to an electronic messaging system to implement the method of the invention. The system includes:
  at least one memory to store the data of the first descriptor, the data of the second descriptor, the preconfigured messages of the library and the data generated by the method;

a calculator to accomplish the operations to transform the first descriptor into a library of preconfigured messages;

a calculation of at least one instance of a preconfigured message.

BRIEF DESCRIPTION OF THE FIGURES

Other characteristics and advantages of the invention will be seen clearly on reading the detailed description below, with reference to the appended figures, which illustrate.

DESCRIPTION

Figure 1:
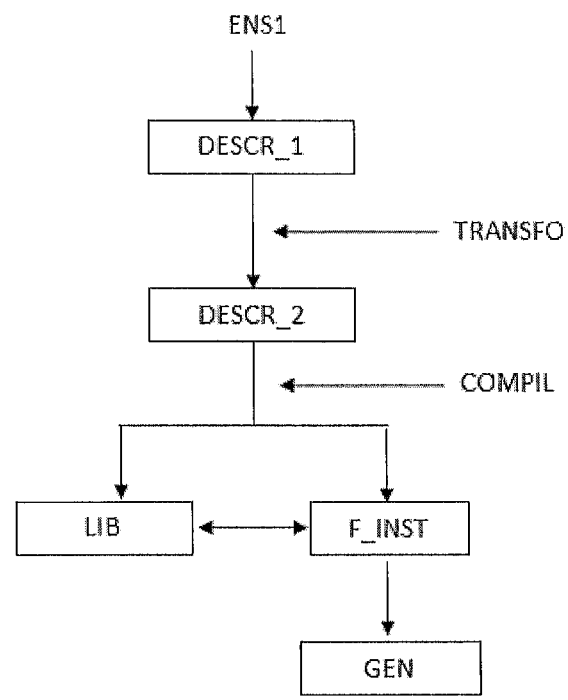
FIG. 1: the principal steps of the method of the invention.

The invention relates to the generation of a library of messages of a given repository to use it in an electronic messaging system. The said messages are preconfigured to optimise the data space required to describe an object.

The invention therefore relates to the generation of a dataset in a memory M defining an instantiation of a message preconfigured in this manner.

The invention has the benefit that it makes a set of preconfigured messages available to a user wishing to define an electronic messaging system, or to a user wishing to define a message. An interface enables a preconfigured message to be determined, and to be instantiated simply. Each message is defined optimally with the minimum number of bytes enabling to values of an attribute to be defined.

The invention enables the implementation of an electronic messaging system to be facilitated wherein the objects must occupy a minimum memory space, with the goal of being transmitted in a radio environment of limited transmission rate. To this end objects with a minimum number of bytes must be defined. These objects are, for example, defined from more complete objects defined over a larger number of bytes.

An object includes at least one attribute which is defined by a given type. A size-optimised object includes attributes defined by size-optimised types. The term "size optimisation" is used when the number of bytes defining an element of a given repository is reduced for use with a repository of optimised messages, called repository REF H in the invention.

A type optimised when it is generated from an original type, TYP_ORI, is called a "reduced type", TYP_RED. According to one embodiment, the invention includes a set of rules enabling reduced types TYP_RED to be generated automatically from original types TYP_ORI.

Example of the "Position" Type

As an example, the object defining a "position" can be defined by an original type having a latitude, a longitude and an altitude.

A first example of generation of a reduced type POSITION_RED from an original type POSITION_ORI is to delete the altitude parameter, to define an object where altitude is not used.

A second example of generation of a reduced type POSITION_RED from an original type POSITION_ORI is to limit the number of decimals defining a latitude and/or a longitude and/or an altitude, by this means enabling the number of bytes defining each parameter of the type POSITION_RED to be reduced.

A third example of generation of a reduced type POSITION_RED from an original type POSITION_ORI is to limit the range of possible values of the values assigned to each parameter, so as to enable improved encoding of a position over a smaller range of values.

Another example can be a combination of the previous examples.

Information Loss

Generation of a reduced type TYP_RED from an original type TYP_ORI generally implies loss of information. The invention enables a number of preconfigured messages to be available, where each enables a compromise to be made between:

firstly, transmission of a reliable element of information for a given level of precision, and;

secondly, an optimisation of the transmission rate of the data which will be transmitted to ensure that the message is transmitted with certainty.

Other objects including reduced types TYP_RED can be defined to reduce the size of the messages to be transmitted. For example, a reduced type "DATE_RED" can be defined from an original type "DATE_ORI" which defines a date with millisecond accuracy. The "DATE_RED" type can be defined with accuracy of the order of one second. Generation of the reduced type DATE_RED can be obtained by truncating the original type DATE_ORI.

FIG. 1 represents the principal steps of the method of the invention.

XML Data Descriptor

In a first stage, a dataset, noted ENS1, is described in a descriptor DESCR_1. Descriptor DESCR_1 includes fields which define the objects enabling the different elements of a message, their attributes and the type of each attribute to be composed. A calculator K can be used to define, in particular, the types reduced from the original types. According to one embodiment, and depending on the desired data compression, i.e. the reduction of the number of bytes which it is desired to obtain for a message, calculator K enables reduced types TYP_RED of different kinds to be is defined.

Configuration of such a compression may depend:

on a desired given repository of optimised messages or, alternatively;

on a particular mission imposing specific transmission rate constraints implying, for example, that new messages are defined in the repository.

The change from an original type TYP_ORI to a reduced type TYP_RED can be achieved in various ways, such as, for example, by a data truncation operation and/or by an operation to reduce a set of listed values and/or an operation to change type, etc.

An original type TYP_ORI can also be used to define different reduced types TYP_RED which will be used depending on the message which will be instantiated.

According to a first example, a message MES indicating a instruction for an aircraft to land at a given position must include the altitude of the position. Conversely, the position can be defined with an accuracy of the order of one centimetre, not one millimetre.

According to a second example, a message MES indicating a meeting point does not require an altitude to be defined. Only latitude and longitude are needed to define a meeting point.

Thus, different objects can be defined with different attributes having types appropriate for the description of the object in question. Depending on the context and the message to be generated, reduced types TYP_RED define the different attributes of an object.

Advantageously, descriptor DESCR_1 can be a file of XSD or XML format. It should be noted that the acronym "XSD" refers to "XML Schema Documentation". It should also be noted that the acronym "XML" refers to "Extensible Markup Language".

Other file formats can be used depending on the method of the invention.

One benefit of using a format such as XML is that, while reading messages MES of repository REF H transiting over a communication channel, an operation to interpret message MES can be commenced in order to generate a display of the content in a display interface.

The date of the messages, objects and types of descriptor DESCR_1 enable a repository noted REF H to be defined. This descriptor DESCR_1 enables repository REF H to be kept up-to-date, for example when publishing new objects, new types or new messages to be described.

A data descriptor thus enables the various messages which can be used in a messaging system, the attributes of each message and each type of the attributes of these messages to be described.

Transformation

The invention includes a step of transformation of the data of first descriptor DESCR_1 into a library LIB of preconfigured messages MES. Library LIB of preconfigured messages enables the messages encoded in repository REF H to be defined in a state in which each of them is ready to be instantiated simply by a single command of an operator. Thus, when configuring a messaging system there is no need to encode new reduced types directly in the messaging system's interface.

This transformation comprises two stages.

Initially the transformation of the invention includes a step enabling, from the data defining the objects of the messages in a first descriptor DESCR_1, data to be generated which describes these same objects in a second data descriptor DESCR_2.

The term "object" of a message is understood to mean either the message itself containing a set of attributes, each attribute of which has a type, or an element enabling a part of a message to be defined.

The transformations can be accomplished through a set of transformation rules allowing one descriptor file to be transformed into another. These rules can be defined so as to organise and structure the descriptor files according to a predefined logic.

In a second stage, from second descriptor DESCR_2, the transformation of the invention includes a step enabling generation of:
a library LIB of preconfigured messages, noted MES_H;
a function F_INST to instantiate a message MES of said library LIB.

This second stage is also called COMPIL in FIG. 1.

All messages H constitute a part of repository REF_H in which the messages can be used directly by an instantiation operation, according to a given context.

Generation of Data of an Optimised Message

When an instantiation of a preconfigured message MES of library LIB is commenced a dataset is generated and then stored in a memory M. The step of generation of this data is noted GEN in FIG. 1. This may relate, alternatively, to a reservation of space in a memory M in order to store the message when it is generated from the messaging system.

Encoding/Decoding

When a user wishes to generate a message in repository REF_H they can instantiate a message with parameters. In particular, the method of the invention allows various possibilities, including:

evaluating the size in bytes of a message MES of repository REF H;
checking that the types of an object are indeed defined in repository REF H when defining a new message;
encoding a message from another repository which is less constrained by a data compression operation, i.e. by a reduction of the number of bytes encoding the message.

In addition, according to one embodiment of the invention, when receiving a message MES through a communication interface, instantiation function F_INST enables an incoming message to be decoded to obtain the parameters from the received message. An operation to compare the decoded message received with messages MES_H of library LIB enables the parameters of the received message to be obtained.

The method of the invention therefore enables:
firstly, transmitted messages to be interpreted and then displayed in an interface by means of a first descriptor DECSR_1;
secondly, a library LIB of preconfigured messages to be generated.

In particular, library LIB of preconfigured messages MES enables reduced type TYP_RED encoding errors to be prevented. Indeed, encoding of a type requires that each byte is manipulated, and particularly substantial configuration when defining an object or a message, By virtue of the method of the invention, interoperability is ensured between the different messaging systems of a given system. In addition, the definition of a repository REF_H is permanent and can be changed.

Description of the System's Components

Figure 2A:
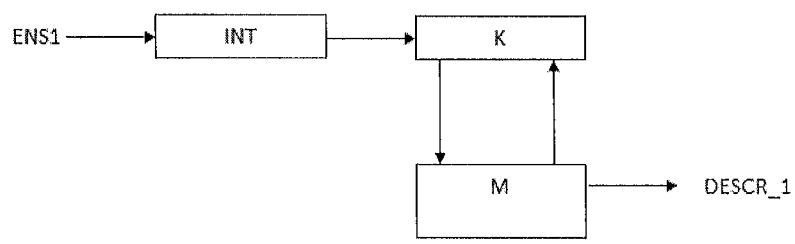
FIG. 2: the principal components of the system of the invention to implement the method of the invention.

FIG. 2A represents, according to one embodiment, the components of the system of the invention to enable generation of a descriptor DESCR_1. Dataset ENS1 can be acquired by a data management interface, or alternatively by receiving a file, or alternatively by reading a file stored in a memory M. When operations to generate a reduced type TYP_RED from an original type TYP_ORI are accomplished automatically, a calculator K enables various compression operations to be accomplished, for example a truncation of a type.

The data describing the objects in repository REF_H by means of descriptor DESCR_1 is stored in a memory M. Memory M can be the one mentioned above or another memory.

Figure 2B:
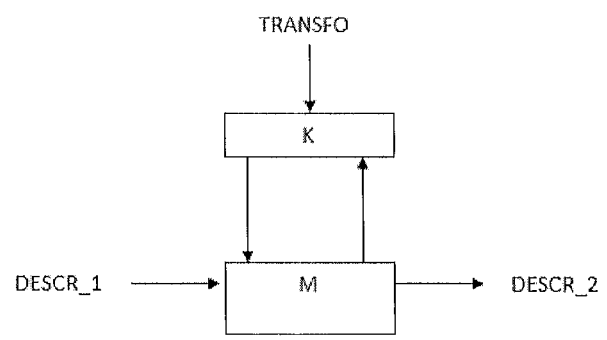

FIG. 2B represents, according to one embodiment of the invention, the components of the system of the invention to enable generation of a second descriptor DESCR_2. Transformation of the data of first descriptor DESCR_1 into a second descriptor DESCR_2 can be accomplished by means of a calculator K. This calculator may be identical or different to the previous calculator. The transformations can be accomplished through a set of transformation rules allowing one descriptor file to be transformed into another.

The benefit of using two descriptors DESCR_1 and DECSR_2 is that each accomplishes a given function. In particular, first descriptor DESCR_1 allows messages MES transiting over a communication channel to be interpreted graphically, while second descriptor DESCR_2 allows a library s of messages to be generated, each of which may be instantiated. In addition, first descriptor DESCR_1 may be used as a repository for message H when it is desired to modify the repository, for example by defining new messages. Second descriptor DESCR_2 enables the library to be updated through the transformation of the invention TRANSFO when the messaging system is deployed in various systems.

The data of descriptor DESCR_2 can be stored in a memory M which can be identical or different to the previous memory.

Figure 2C:
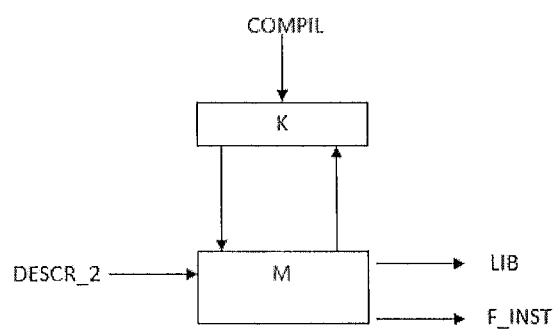

FIG. 2C represents, according to one embodiment of the invention, the components of the system of the invention to enable the final step of transformation of the data of descriptor DESCR_1. When it is generated, the data of descriptor DECSR_2 is compiled using function COMPIL to allow a library LIB of preconfigured messages to be generated, and an instantiation function F_INST to be generated enabling each message of library LIB to be instantiated when these messages are called or used during an operation of an operator.

Message library LIB is stored in a memory M of the system, and function COMPIL can be executed using a calculator of the system. Memory M and calculator K, which enable these functions to be executed, can be dedicated to these applications. According to another embodiment they can be the same ones as those described above.

The invention claimed is:

1. A method for generating a dataset defining a message, comprising:
    defining a first descriptor of a set of messages, wherein each message includes a set of attributes, wherein the first descriptor describes a set of reduced types of attributes, and wherein each reduced type of attribute is encoded from a corresponding original type of attribute;
    transforming the first descriptor into a library of preconfigured messages defining a given repository;
    instantiating a message of the given repository to generate a dataset in a memory,
        wherein the transformation of the first descriptor includes:
        generating a second descriptor; and
        compiling the second descriptor to generate:
            the library of preconfigured message; and
            a function to instantiate a selected message, and
        wherein the second descriptor is generated based on a set of transformation rules allowing the first descriptor to be transformed into the second descriptor.

2. The method according to claim 1, wherein the definition of the first descriptor includes a set of rules defining ranges of values of a reduced type of attribute, wherein the ranges of values of the reduced type of attribute are included in ranges of values defining an original type of attribute.

3. The method according to claim 1, wherein an encoding of a reduced type of attribute includes a reduction of a number of bytes encoding an original type of attribute.

4. The method according to claim 1, wherein an encoding of a reduced type of attribute includes a selection of a type of attribute other than an original type of attribute, wherein the other type of attribute has fewer bytes than a number of bytes of the original type of attribute.

5. The method according to claim 1, wherein an encoding of a reduced type of attribute includes a truncation of an original type of attribute.

6. The method according to claim 1, wherein an encoding of a reduced type of attribute includes an extract from a list of values of an original type of attribute.

7. The method of claim 1, wherein the set of transformation rules organize and structure the second descriptor based on a predefined logic.

8. The method of claim 1, further comprising:
    decoding, using the function, an incoming message to obtain parameters from the incoming message.

9. The method according to claim 1, wherein the instantiated message is to be transmitted in a radio environment.

10. The method of claim 1, wherein the first descriptor is of XML (Extensible Markup Language) or XSD (XML Schema Documentation) format.

* * * * *